United States Patent
Yoon et al.

(10) Patent No.: US 9,202,896 B2
(45) Date of Patent: Dec. 1, 2015

(54) TFT, METHOD OF MANUFACTURING THE TFT, AND METHOD OF MANUFACTURING ORGANIC LIGHT EMITTING DISPLAY DEVICE INCLUDING THE TFT

(71) Applicant: Samsung Display Co., Ltd., Yongin, Gyeonggi-Do (KR)

(72) Inventors: Joo-Sun Yoon, Yongin (KR); Ki-Wan Ahn, Yongin (KR); Joung-Keun Park, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 13/960,341

(22) Filed: Aug. 6, 2013

(65) Prior Publication Data
US 2014/0145179 A1   May 29, 2014

(30) Foreign Application Priority Data
Nov. 29, 2012 (KR) .......................... 10-2012-0137333

(51) Int. Cl.
| H01L 29/66 | (2006.01) |
| H01L 29/786 | (2006.01) |
| H01L 51/56 | (2006.01) |
| H01L 27/32 | (2006.01) |

(52) U.S. Cl.
CPC ...... *H01L 29/66969* (2013.01); *H01L 29/7869* (2013.01); *H01L 29/78621* (2013.01); *H01L 29/78693* (2013.01); *H01L 27/3262* (2013.01)

(58) Field of Classification Search
CPC .................. H01L 29/4908; H01L 29/78618; H01L 27/1259; H01L 27/1288; H01L 21/02274; H01L 21/461; H01L 21/32136; H01L 21/32139; H01L 29/66969; H01L 29/78693; H01L 51/56
USPC .......................... 257/43, 57, 40; 438/23, 151
See application file for complete search history.

(56) References Cited

U.S. PATENT DOCUMENTS

| 2008/0296565 | A1* | 12/2008 | Park et al. ........................ 257/40 |
| 2009/0283763 | A1* | 11/2009 | Park et al. ........................ 257/43 |
| 2011/0084262 | A1  | 4/2011  | Kondratyuk et al. |
| 2011/0147738 | A1  | 6/2011  | Yamazaki et al. |
| 2011/0204370 | A1  | 8/2011  | Yoon et al. |
| 2011/0240998 | A1  | 10/2011 | Morosawa et al. |
| 2013/0207087 | A1* | 8/2013  | Kim et al. ........................ 257/40 |

FOREIGN PATENT DOCUMENTS

| JP | 2011-146694 A | 7/2011 |
| KR | 10-1056229 B1 | 8/2011 |
| KR | 1020110095615 A | 8/2011 |
| KR | 1020110109885 A | 10/2011 |

* cited by examiner

*Primary Examiner* — Whitney T Moore
(74) *Attorney, Agent, or Firm* — Robert E. Bushnell, Esq.

(57) ABSTRACT

A method of manufacturing a thin film transistor (TFT), including forming an oxide semiconductor pattern including a first region, a second region and a third region on a substrate, directly plasma processing the first region and the second region of the oxide semiconductor pattern, forming an insulating layer on the substrate to cover the oxide semiconductor pattern, forming a gate electrode on the insulating layer to overlap the third region, and forming a source electrode and a drain electrode that are insulated from the gate electrode and that contact the first region, the second region being disposed between the first region and the third region.

11 Claims, 6 Drawing Sheets

TFT, METHOD OF MANUFACTURING THE TFT, AND METHOD OF MANUFACTURING ORGANIC LIGHT EMITTING DISPLAY DEVICE INCLUDING THE TFT

CLAIM OF PRIORITY

This application makes reference to, incorporates the same herein, and claims all benefits accruing under 35 U.S.C. §119 from an application earlier filed in the Korean Intellectual Property Office filed on 29 Nov. 2012 and there duly assigned Serial No. 10-2012-0137333.

BACKGROUND OF THE INVENTION

1. Field of the Invention

The present invention relates to a thin film transistor (TFT) including an active layer formed of an oxide semiconductor, a method of manufacturing the TFT, and a method of manufacturing organic light emitting display device including the TFT.

2. Description of the Related Art

Flat panel display devices such as organic light emitting display devices and liquid crystal display devices include at least one thin film transistor (TFT), a capacitor or the like and a pattern including wirings for connecting these elements formed on a substrate for operation thereof. The TFT is formed of an active layer which provides a channel region, a source region, and a drain region, and a gate electrode that is formed above the channel region and is electrically insulated from the active layer via a gate insulating layer.

The active layer of the TFT as described above is typically formed of a semiconductor material such as amorphous silicon or poly-silicon. When the active layer is formed of amorphous silicon, mobility thereof is low, and thus it is difficult to implement a high-speed circuit therein, and when the active layer is formed of poly-silicon, mobility thereof is high but a threshold voltage of the TFT is not uniform, and thus an additional compensation circuit is necessary. Moreover, according to a method of manufacturing a TFT using a low temperature poly-silicon (LTPS), an expensive process such as laser heat treatment is included, and thus the costs for equipment, investment, and management thereof are high, and the method is difficult to apply on a large-sized substrate. Thus, research has recently been conducted into methods and designs of using an oxide semiconductor as an active layer.

SUMMARY OF THE INVENTION

The present invention provides a thin film transistor (TFT) including an active layer formed of an oxide semiconductor, a method of manufacturing the TFT, and a method of manufacturing organic light emitting display device including the TFT.

According to one aspect of the present invention, there is provided a method of manufacturing a thin film transistor (TFT) that includes forming an oxide semiconductor pattern including a first region, a second region, and a third region, on a substrate, directly plasma processing the first region and the second region of the oxide semiconductor pattern, forming an insulating layer on the substrate to cover the oxide semiconductor pattern, forming a gate electrode on the insulating layer to overlap with the third region and forming a source electrode and a drain electrode that are insulated from the gate electrode and that contact the first region, the second region being disposed between the first region and the third region. The directly plasma processing may include reducing the first region and the second region.

The forming of the oxide semiconductor pattern may include forming an oxide semiconductor layer on the substrate and forming the oxide semiconductor pattern by using a first photosensitive pattern as a mask, the directly plasma processing may include directly plasma processing the first region and the second region of the oxide semiconductor pattern by using a second photosensitive pattern as a mask and removing the second photosensitive pattern. The first photosensitive pattern and the second photosensitive pattern may be formed by a single mask operation. The first photosensitive pattern may be formed using one of a halftone mask and a diffraction mask. A portion of the first photosensitive pattern corresponding to the third region may be thicker than portions of the first photosensitive pattern corresponding to each of the first region and the second region, the second photosensitive pattern may only corresponds to the third region. The second photosensitive pattern may be formed by ashing the first photosensitive pattern. The first photosensitive pattern may be removed by using a plasma. The plasma process may be formed using at least one gas selected from hydrogen gas, argon gas, helium gas, xenon gas, nitrogen gas, nitrogen oxide gas and oxygen gas.

According to another aspect of the present invention, there is provided a method of manufacturing an organic light emitting display device that includes manufacturing a thin film transistor (TFT) on a substrate, forming a protection layer on the TFT, forming an organic light emitting diode (OLED) on the protection layer and forming an encapsulation layer to encapsulate the OLED, the manufacturing of a TFT may include forming an oxide semiconductor pattern including a first region, a second region, and a third region on the substrate, directly plasma processing the first region and the second region of the oxide semiconductor pattern, forming an insulating layer on the substrate to cover the oxide semiconductor pattern, forming a gate electrode on the insulating layer to overlap with the third region and forming a source electrode and a drain electrode that are insulated from the gate electrode and that contact the first region, wherein the second region is disposed between the first region and the third region. The directly plasma processing may include reducing the first region and the second region.

The forming of an oxide semiconductor pattern may include forming an oxide semiconductor layer on the substrate and forming the oxide semiconductor pattern by using a first photosensitive pattern as a mask, the directly plasma processing may include directly plasma processing the first region and the second region of the oxide semiconductor pattern by using a second photosensitive pattern as a mask and removing the second photosensitive pattern. The first photosensitive pattern and the second photosensitive pattern may be formed in a single mask operation. The first photosensitive pattern may be formed using one of a halftone mask and a diffraction mask. A portion of the first photosensitive pattern corresponding to the third region may be thicker than portions of the first photosensitive pattern corresponding to each of the first region and the second region, the second photosensitive pattern may only correspond to the third region. The second photosensitive pattern may be formed by ashing the first photosensitive pattern. The second photosensitive pattern may be removed simultaneously with the direct plasma processing. The plasma process may be formed using at least one gas selected from hydrogen gas, argon gas, helium gas, xenon gas, nitrogen gas, nitrogen oxide gas and oxygen gas.

According to yet another aspect of the present invention, there is provided a thin film transistor (TFT) that includes an oxide semiconductor pattern that is formed on a substrate and comprises a first region, a second region, and a third region, wherein the second region is disposed between the first region and the third region, a gate electrode that is insulated from the oxide semiconductor pattern and overlaps the third region and a source electrode and a drain electrode that are insulated from the gate electrode and contact the first region, the second region may have a smaller electrical resistance than the third region. The oxide semiconductor may include an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), and zinc (Zn).

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
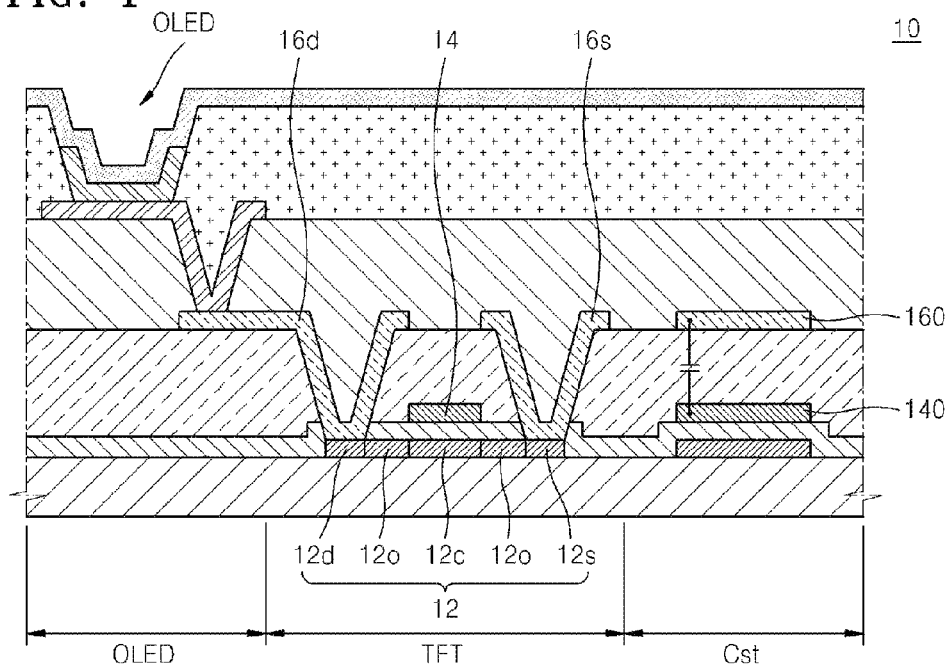
FIG. 1 illustrates a thin film transistor (TFT) according to a comparative example.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

The terms such as "first" and "second" are used herein merely to describe a variety of constituent elements, but the constituent elements are not limited by the terms. The terms are used only for the purpose of distinguishing one constituent element from another constituent element.

It will be understood that when a layer is referred to as being "on" another layer, film, area or substrate, it can be directly on the other layer, film, area or substrate, or intervening layers may also be present.

In the drawings, the thicknesses of layers and areas are extended for clarity of description. Also, in the drawings, for convenience of description, the thicknesses of some of layers or areas are exaggerated.

The present invention will now be described more fully with reference to the accompanying drawings, in which exemplary embodiments of the invention are shown. Material identical or corresponding components are labeled with identical reference numerals, and description thereof will not be repeated.

As used herein, the term "and/or" includes any and all combinations of one or more of the associated listed items. Expressions such as "at least one of," when preceding a list of elements, modify the entire list of elements and do not modify the individual elements of the list.

Turning now to FIG. 1, FIG. 1 illustrates a thin film transistor (TFT) according to a comparative example for comparison with a TFT according to an embodiment of the present invention. The TFT including an active layer formed of an oxide semiconductor may be implemented as a bottom gate type and a top gate type. In a bottom gate type TFT, a gate electrode is formed below an active layer, and in a top gate type TFT, a gate electrode is formed above an active layer.

A bottom gate type TFT has a large parasitic capacitance, and when used as a TFT within a display device, power consumption is high, an aperture ratio is reduced, and dead space increases. Thus, a top gate type TFT may preferably be used as a TFT within a display device which demands low power consumption and a high resolution by reducing parasitic capacitance.

However, if a TFT including an active layer formed of an oxide semiconductor is formed to have a top gate type, an offset area 12o is created. Effective mobility of charges of an oxide semiconductor is relatively high compared to a silicon material, and thus an additional doping operation is not necessary. However, as a doping operation is not performed, the offset area 12o exists in a top gate type TFT. As illustrated in FIG. 1, the offset area 12o refers to a channel region 12c overlapping with a gate electrode 14 and an area between source/drain regions 12s and 12d contacting source/drain regions 16s and 16d. When the offset area 12o is formed, the TFT may not have stable characteristics.

According to an embodiment of the present invention, an offset of a top gate type TFT including an active layer formed of an oxide semiconductor is provided. This will be described in detail below with reference to the drawings.

Figure 2:
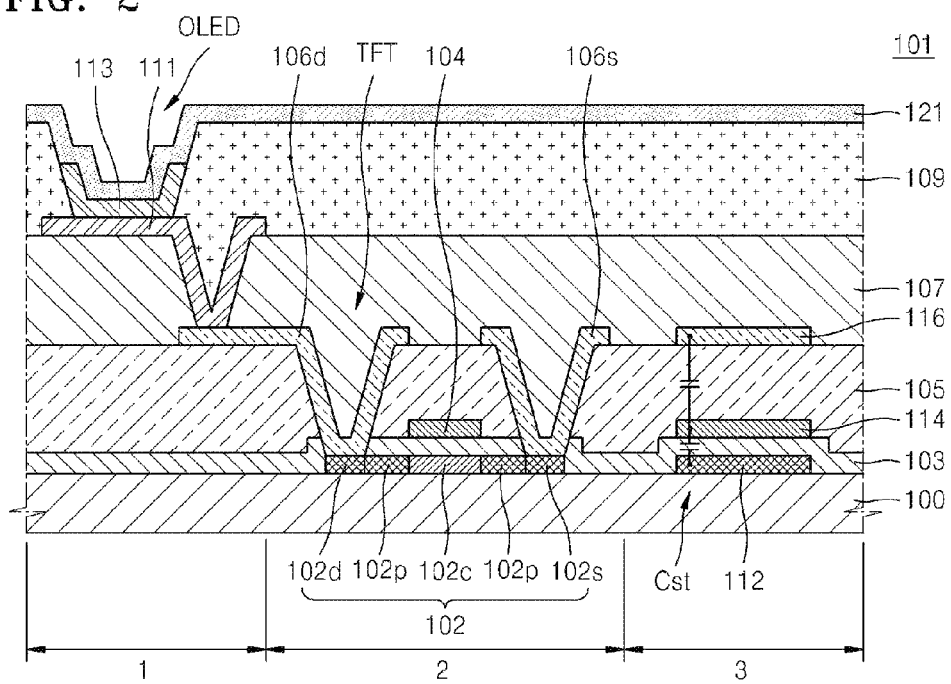
FIG. 2 is a schematic cross-sectional view of an organic light emitting display device including a TFT that is manufactured according to a method of an embodiment of the present invention.

Turning now to FIG. 2, FIG. 2 is a schematic cross-sectional view illustrating an organic light emitting display device 101 including a TFT manufactured according to a method of an embodiment of the present invention. Referring to FIG. 2, the organic light emitting display device 101 includes at least one TFT, a capacitor Cst, and an organic light emitting diode (OLED) that is electrically connected to the TFT.

The TFT according to the current embodiment of the present invention is a top gate type, and sequentially includes an active layer 102 formed of an oxide semiconductor pattern, a gate electrode 104 that is insulated from the active layer 102, and source/drain electrodes 106s and 106d contacting the active layer 102.

The active layer 102 including an oxide semiconductor includes first regions 102s and 102d, second regions 102p, and a third region 102c. The first regions 102s and 102d are areas contacted by source/drain electrodes 106s and 106d and correspond to a source/drain region. The third region 102c is overlapped by a gate electrode 104, and corresponds to a channel region. The second regions 102p correspond to the offset area of the TFT according to the comparative example of FIG. 1. The TFT of FIG. 2 according to the current embodiment of the present invention is different from the TFT of the comparative example of FIG. 1 in that a resistance of the second regions 102p is smaller than a resistance of the third region 102c. That is, the second region 102p is characterized in that its oxygen vacancy is high and it has characteristics of a conductor. As the offset area of the TFT according to the comparative example is not included in the TFT according to the present invention, even when an active layer is formed of an oxide semiconductor having a top gate configuration, stable TFT characteristics may be achieved. As a result, an organic light emitting display device having a small parasitic capacitance, a high aperture ratio, and stable characteristics may be manufactured.

Meanwhile, the capacitor Cst includes a bottom electrode 112, an intermediate electrode 114, and a top electrode 116. The bottom electrode 112 is formed of an oxide semiconductor having conducting characteristics. Accordingly, unlike the TFT of the comparative example which inevitably includes a capacitor including an intermediate electrode 140 and a top electrode 160 as two opposite electrodes, the TFT according to the current embodiment of the present invention includes the bottom electrode 112 including an oxide semiconductor having conducting characteristics, and thus, the capacitor Cst further includes a sub-capacitor including the bottom electrode 112 and the intermediate electrode 114 as two opposite electrodes.

Figure 3:
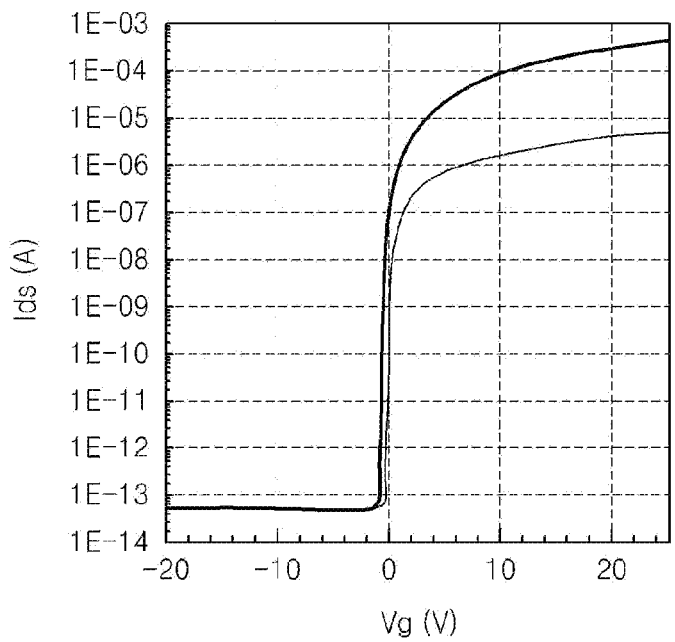
FIG. 3 is a graph showing I-V characteristics of the TFT of the comparative example of FIG. 1.
Figure 4:
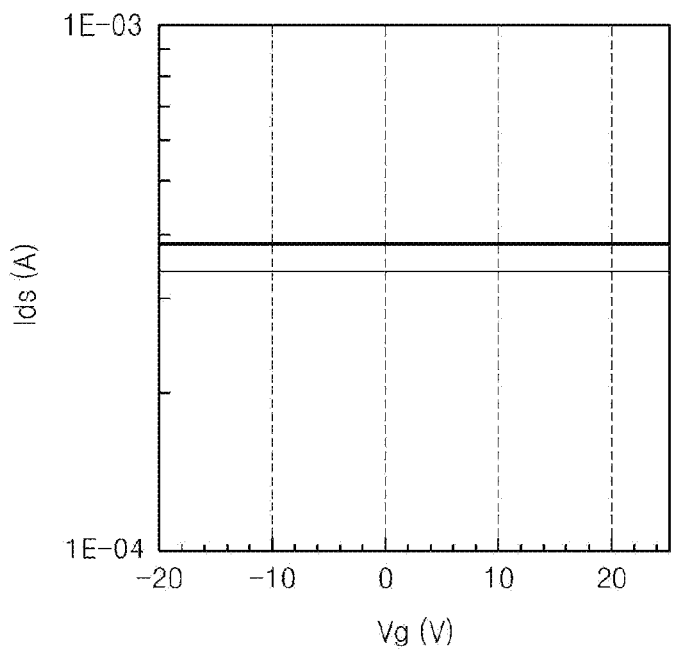
FIG. 4 is a graph showing I-V characteristics of the organic light emitting display device of the TFT of FIG. 2 according to an embodiment of the present invention.

Turning now to FIGS. 3 and 4, FIG. 3 is a graph showing I-V characteristics of the TFT according to the comparative example of FIG. 1, and FIG. 4 is a graph showing I-V characteristics of the TFT of FIG. 2 according to the current embodiment of the present invention. Differently from FIG. 3, as the offset area is changed to a conductive area by direct plasma processing, the I-V characteristics shown in a semiconductor as in FIG. 3 are removed, and I-V characteristics shown in a conductor as in FIG. 4 are exhibited.

FIGS. 5 through 15 are schematic views illustrating a method of manufacturing the organic light emitting display device 101 of FIG. 2 according to an embodiment of the present invention.

First, a substrate 100 on which an organic light emitting display device is to be manufactured is prepared. In detail, the substrate 100 may be formed of a transparent glass material having Sift, as a main component. However, the substrate 100 is not limited thereto, and may instead be a substrate formed of various other materials such as a transparent plastic material or a metal.

Meanwhile, auxiliary layers, such as a barrier layer, a blocking layer and/or a buffer layer, may be formed on the substrate 100 to prevent diffusion of impurities or ions and penetration of water or external air into the substrate 100. However, the auxiliary layers may be selectively included, and the organic light emitting display device 101 illustrated in FIG. 2 does not require an auxiliary layer.

Figure 5:
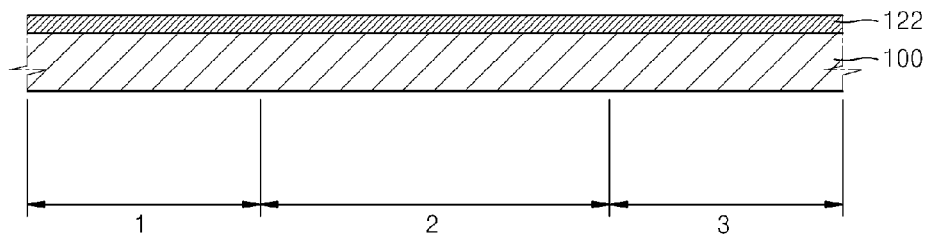
FIG. 5 is an initial manufacturing step where an oxide semiconductor layer is formed on the entire surface of the substrate.

Next, as illustrated in FIG. 5, an oxide semiconductor layer 122 is formed on the entire surface of the substrate 100. The oxide semiconductor may include at least one oxide selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the oxide semiconductor may include Ga, In, and Zn in an atom % of 2:2:1. However, the oxide semiconductor is not limited thereto, and may also be formed of a quaternary metal oxide such as an In—Sn—Ga—Zn—O based material, a ternary metal oxide such as In—Ga—Zn—O, In—Sn—Zn—O, In—Al—Zn—O, Sn—Ga—Zn—O, Al—Ga—Zn—O, Sn—Al—Zn—O, or Cd—Sn—O based material, a binary metal oxide such as In—Zn—O, Sn—Zn—O, Al—Zn—O, Zn—Mg—O, Sn—Mg—O, or In—Mg—O based material, or a single-component metal oxide such as an In—O, Sn—O, Zn—O, Ti—O or Cd—O based material. Here, an In—Ga—Zn—O based oxide semiconductor refers to an oxide including at least In, Ga, and Zn, and its combination ratio is not limited. In addition, the In—Ga—Zn based material may include other elements in addition to In, Ga, and Zn.

The TFT including an active layer formed of an oxide semiconductor has higher mobility than a conventional Si TFT, and thus ion doping for achieving a higher mobility is not necessary. Also, the TFT formed of an oxide semiconductor includes a polycrystalline and amorphous structure at a room temperature, and thus an annealing operation is not necessary, so that the TFT may be manufactured at a low temperature. Also, an active layer may be formed using a method such as sputtering, and thus the oxide semiconductor TFT may be applied to a large-sized substrate, and the material costs therefor are low.

Figure 6:
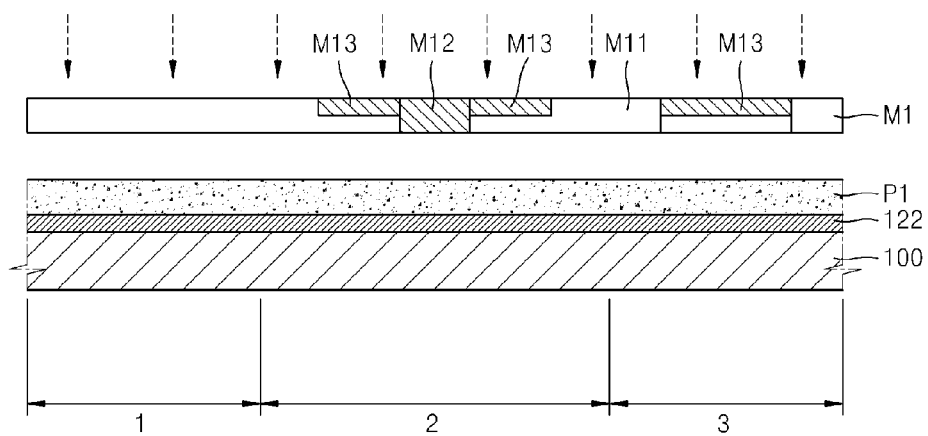
FIG. 6 illustrates a patterning step in which a photoresist layer is patterned by a half-tone mask.

Next, referring to FIG. 6, a photosensitive material such as a photoresist may be coated on the structure of FIG. 5 to form a photoresist layer P1, and then a solvent is removed by pre-baking, soft baking or the like. Then, to pattern the photosensitive layer P1, a halftone mask M1 having a predetermined pattern is aligned with the substrate 100, and exposure is conducted by irradiating light of a predetermined wavelength onto the photosensitive layer P1.

The halftone mask M1 includes a light transmitting unit M11, a light blocking unit M12, and a semi-transmissive unit M13. The light transmitting unit M11 transmits light of a predetermined wavelength, the light blocking unit M12 blocks irradiated light, and the semi-transmissive unit M13 allows only a portion of the irradiated light to pass.

The halftone mask M1 illustrated in FIG. 6 is a conceptual diagram of a mask in order to described functions of respective elements of the halftone mask M1, and in reality, the halftone mask M1 may be formed as a predetermined pattern on a transparent substrate such as quartz. Here, the light blocking unit M12 may be formed by patterning a material such as chromium or chromium dioxide on a quartz substrate, and the semi-transmissive unit M13 may adjust light transmittivity of irradiated light by adjusting a combination ratio or a thickness of at least one of chromium, silicon, molybdenum, tantalum, and aluminum.

Figure 7:
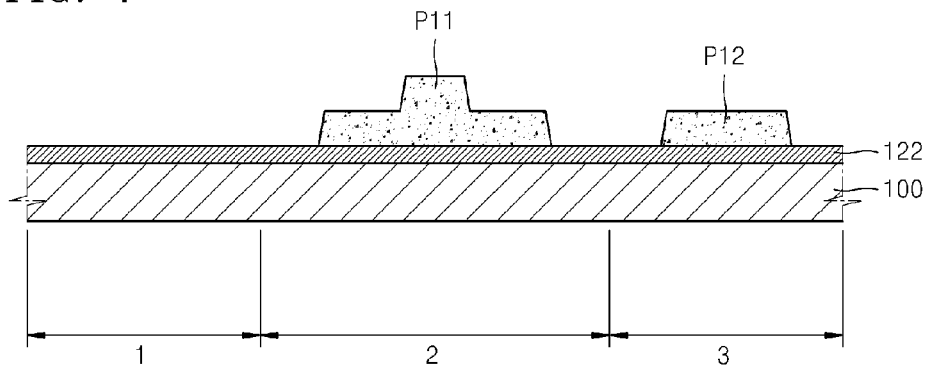
FIG. 7 illustrates a first photoresist pattern that remains after performing a developing operation.

Referring now to FIG. 7, first photoresist patterns, which are remaining portion of the photosensitive layer P1 after performing a developing operation in which a photosensitized portion of the photosensitive layer P1 is removed, is schematically illustrated. While a positive (positive-PR) from which a photosensitized portion is removed is used in the current embodiment of the present invention, the present invention is not limited thereto, and a negative photoresist from which an unphotosensitized portion is removed may instead be used.

First photoresist patterns P11 and P12 are resultant products after portions of the photosensitive layer P1 corresponding to the light transmitting unit M11 of the halftone mask M1 are removed, and a portion of the photosensitive layer P1 corresponding to the semi-transmissive unit M13 is left. A thickness of the photosensitive layer of the first photosensitive patterns P11 and P12 corresponding to the semi-transmissive unit M13 is thinner than a thickness of a the photosensitive layer corresponding to the light blocking unit M12, and the thickness of the photosensitive layer of the first photosensitive patterns P11 and P12 corresponding to the semi-transmissive unit M13 may be adjusted by adjusting a combination ratio or a thickness of a material of a pattern of the semi transmissive unit M13.

By using the first photosensitive patterns P11 and P12, the oxide semiconductor layer 122 is etched using an etching equipment. The etching operation may be performed in various manners, for example, by using a wet etching method or a dry etching method.

Figure 8:
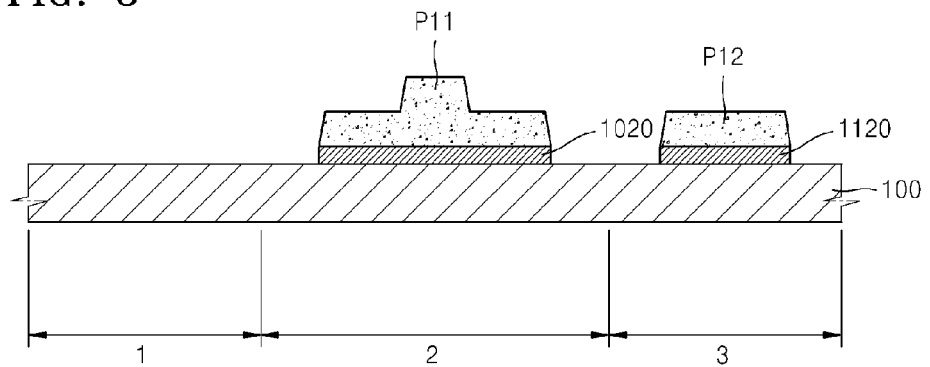
FIG. 8 illustrates a patterned oxide semiconductor layer after being etched using the first photoresist pattern as an etch mask.

Referring now to FIG. 8, an exposed portion of the oxide semiconductor layer 122 of FIG. 7 are etched away so that an oxide semiconductor pattern 1020 corresponding to the active layer 102 is formed in a TFT area 2, and an oxide semiconductor pattern 1120 corresponding to the bottom electrode 112 is formed in a storage area 3.

Figure 9:
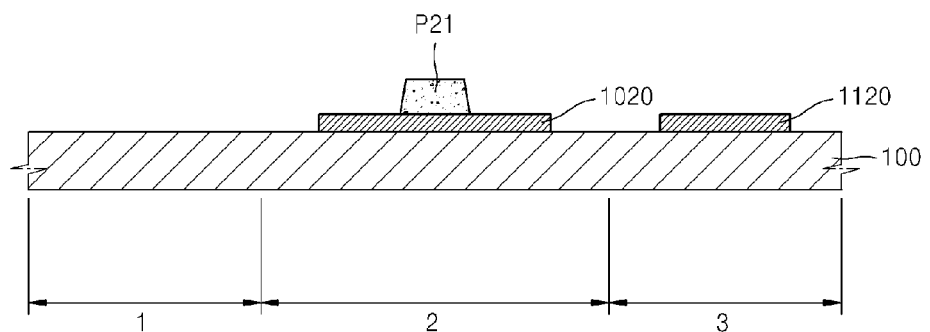
FIG. 9 illustrates a second photoresist pattern produced after an ashing process on the first photoresist pattern.

Referring now to FIG. 9, an ashing operation, which is an operation of removing a photosensitive layer, is performed to etch a photosensitive layer portion of the first photosensitive patterns P11 and P12 corresponding to the semi-transmissive unit M13 of FIG. 6. Here, the photosensitive layer portion corresponding to the light blocking unit M12 of FIG. 6 remains and constitutes a second photosensitive pattern P21, since only a thickness thereof is reduced even though the ashing operation is uniformly performed.

Meanwhile, although the photosensitive layer portions corresponding to the semi-transmissive unit M13 of mask M1 are removed by the ashing operation, portions of the oxide semiconductor patterns 1120 and 1020 that correspond to the semi-transmissive unit M13 of mask M1 remain, and plasma processing is performed on these exposed portions of the oxide semiconductor patterns 1120 and 1020 by using the second photosensitive pattern P21 as a mask.

Figure 10:
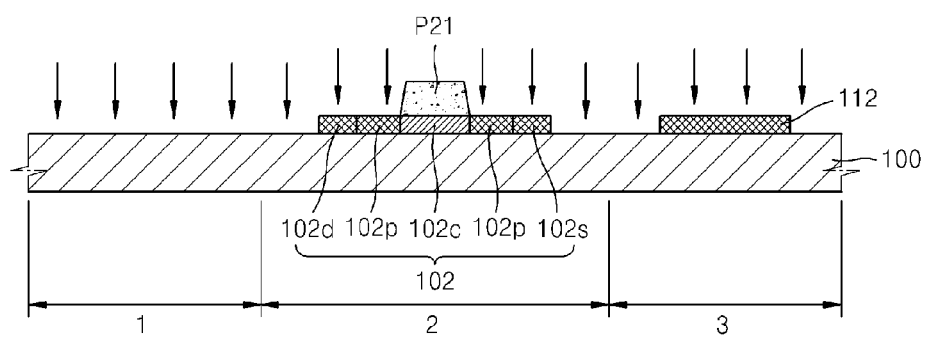
FIG. 10 illustrates a direct plasma process being performed to produce an active layer for a TFT by reducing and making conductive exposed portions of the patterned oxide semiconductor layer using the second photoresist pattern as a processing mask.

Referring now to FIG. 10, portions of the oxide semiconductor patterns 1120 and 1020 that are not covered by the second photosensitive pattern P21 but are exposed after the ashing process of FIG. 9 are subjected to a direct plasma process. The direct plasma process results in the exposed portions of the oxide semiconductor patterns 1120 and 1020 to have characteristics of an electrical conductor, thereby forming an active layer 102 that is absent of an offset area.

Plasma processing is an operation in which particles having a high energy in a plasma state collide with a surface of a material to thereby modify the surface of the material chemically or physically. According to the present invention, when plasma processing is performed, at least one gas selected from a hydrogen gas, an argon gas, a helium gas, a xenon gas, a nitrogen gas, a nitrogen oxide gas, an oxygen gas, and a mixed gas of these may be used.

By plasma processing an oxide semiconductor, the oxide semiconductor is reduced, and oxygen defects contained in the oxide semiconductor is induced to increase oxygen vacancy. A carrier density of the oxide semiconductor whose oxide vacancy is increased is likely to increase, and consequently a density of a threshold voltage, which is a critical voltage at which conductivity can occur, is moved in a negative direction. This means that the oxide semiconductor has obtained properties of a conductor so as to readily conduct electricity.

Figure 11:
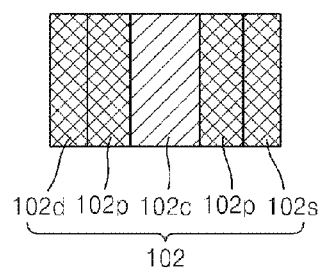
FIG. 11 is a schematic plan view of the active layer produced by the process of FIG. 10.

Turning now to FIG. 11, FIG. 11 is a schematic plan view of the active layer 102 formed in the TFT area 2. Referring to FIGS. 10 and 11, the oxide semiconductor pattern 1020 in the TFT area 2 includes first regions 102s and 102d, second regions 102p, and a third region 102c. In detail, a portion of the oxide semiconductor pattern 1020 corresponding to the second photosensitive pattern P21 is referred to as a third region 102c, and a portion of the oxide semiconductor pattern 1020 that is not covered by the second photosensitive pattern P21 but exposed during the plasma processing is referred to as first regions 102s and 102d and second regions 102p. Here, the first regions 102s and 102d are edge portions of the oxide semiconductor pattern 1020, which source/drain electrodes are to contact later. The second regions 102p are located between the first regions 102s and 102d and the third region 102c, and corresponds to the offset area of the TFT according to the comparative example of FIG. 1.

The oxide semiconductor pattern 1020 of the TFT area 2 is plasma processed by using the second photosensitive pattern P21 as a self-align mask. Accordingly, the third region 102c that is covered by the second photosensitive pattern P21 is not plasma processed, but maintains original characteristics of a semiconductor. However, the first regions 102s and 102d and the second regions 102p that are exposed to the plasma obtain conductive characteristics. As described above, according to the present invention, as the second regions 102p, which corresponds to the offset area of the TFT according to the comparative example of FIG. 1, obtains characteristics of a conductor and thus the offset area is omitted, even when a TFT has a top gate structure, the TFT may have stable characteristics.

The oxide semiconductor pattern 1120 formed in the storage area 3 does not include a second photoresist pattern, and thus becomes entirely conductive and is used as the bottom electrode 112.

Figure 12:
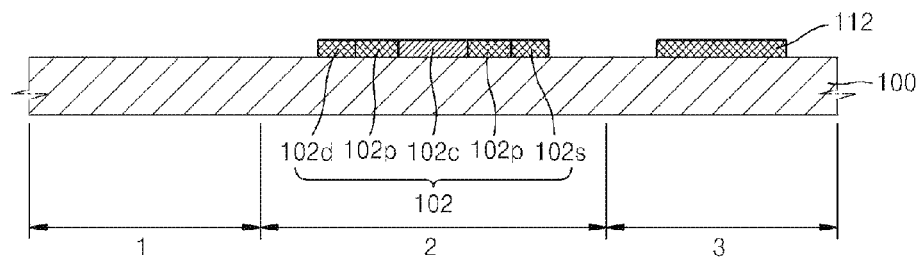
FIG. 12 is a view of the structure of FIG. 10 after a removal of the second photoresist pattern.

Referring now to FIG. 12, an ashing operation is performed to remove the second photosensitive pattern P21 of FIG. 10.

Figure 13:
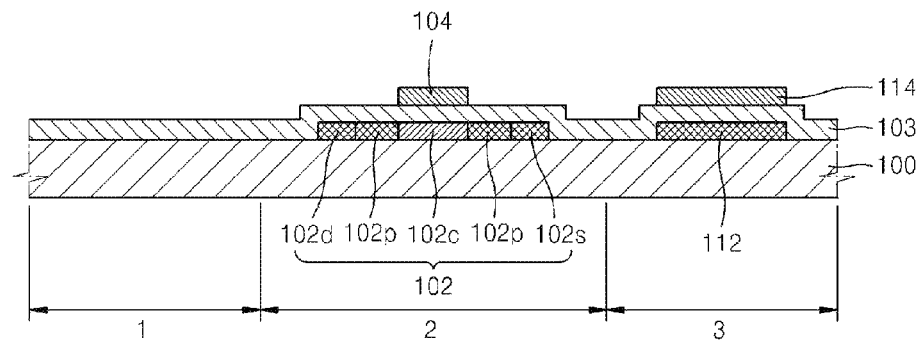
FIG. 13 is a view of the process after a gate insulating layer and a gate electrode are formed on the structure of FIG. 12.

Referring now to FIG. 13, a gate insulating layer 103 is formed on the entire surface of the substrate 100 so as to cover the active layer 102 and the bottom electrode 112. The gate insulating layer 103 insulates the active layer 102 of the TFT from a gate electrode 104, and is disposed between a bottom electrode 112 and an intermediate electrode 114 of a capacitor to function as a dielectric body. The gate insulating layer 103 may be formed of an inorganic insulating material selected from the group consisting of $SiO_2$, $SiN_x$, $Al_2O_3$, $CuO_x$, $Tb_4O_7$, $Y_2O_3$, $Nb_2O_5$, and $Pr_2O_3$ and by using various depositions methods such as a plasma enhanced chemical vapor deposition (PECVD) method, an atmospheric pressure CVD (APCVD) method, a low pressure CVD (LPCVD) method.

A gate electrode 104 and an intermediate electrode 114 are formed on the gate insulating layer 103. The gate electrode 104 is formed to overlap with the third region 102c of the active layer 102 of the TFT area 2. The intermediate electrode 114 is formed to overlap with the bottom electrode 112 of the storage area 3.

The gate electrode 104 and the intermediate electrode 114 may be formed by depositing a conductive layer having a single-layer or multi-layer structure and including at least one material selected from the group consisting of silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), molybdenum (Mo), titanium (Ti), tungsten (W), and copper (Cu) on the entire surface of the gate insulating layer 103, and then patterning the conductive layer by using a mask.

Figure 14:
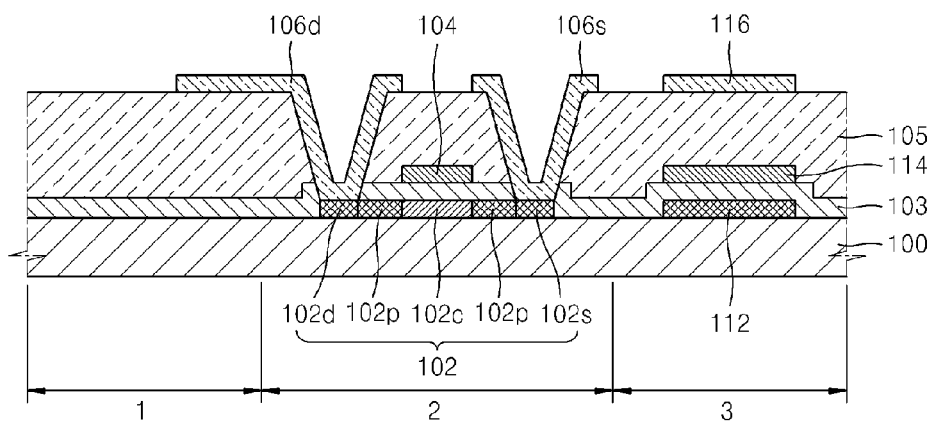
FIG. 14 is a view of the process after an interlayer insulating layer and another electrode layer are formed on the structure of FIG. 13.

Referring now to FIG. 14, an interlayer insulating layer 105 is formed on the entire surface of the substrate 100 to cover the gate electrode 104 and the intermediate electrode 114. A contact hole is formed in the interlayer insulating layer 105 and the gate insulating layer 103 to expose the first regions 102s and 102d of the active layer 102 in the TFT area 2.

The interlayer insulating layer 105 is formed of at least one organic insulating material selected from the group consisting of polyimide, polyimide, an acrylic resin, benzocyclobutene, and a phenolic resin, and is applied using a method such as a spin coating technique. Meanwhile, the interlayer insulating layer 105 may be formed of not only an organic insulating material as described above, but also of an inorganic material selected from the group consisting of $SiO_2$, $SiN_x$, $Al_2O_3$, $CuO_x$, $Tb_4O_7$, $Y_2O_3$, $Nb_2O_5$, and $Pr_2O_3$. Also, the interlayer insulating layer 105 may be formed to have a multi-layer structure in which an organic insulating material and an inorganic insulating material are alternately formed. The interlayer insulating layer 105 may be formed to have a sufficient thickness, for example, to be thicker than the gate insulating layer 103 described above. The contact holes are formed by patterning the interlayer insulating layer 105 by using a mask.

Next, source/drain electrodes 106s and 106d are formed to contact the first regions 102s and 102d of the active layer 102 via the contact holes. A top electrode 116 of the capacitor is formed on the interlayer insulating layer 105 in the storage area 3.

The source/drain electrodes 106s and 106d and the top electrode 116 may be formed by depositing a conductive layer having a single-layer or multi-layer structure and including at least one material selected from silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), molybdenum (Mo), titanium (Ti), tungsten (W), and copper (Cu) on the entire surface of the interlayer insulating layer 105, and then patterning the conductive layer by using a mask.

Figure 15:
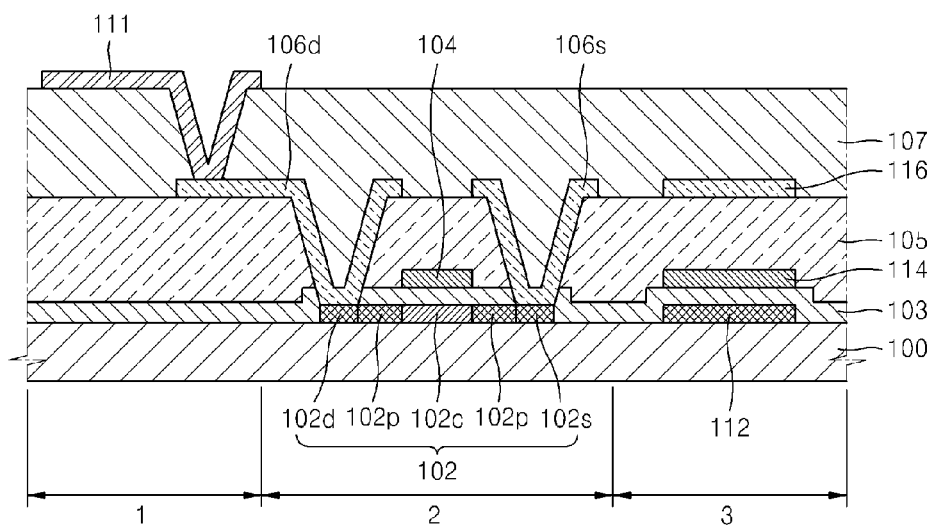
FIG. 15 is a view of the process after a protection layer and a pixel electrode are formed on the structure of FIG. 14.

Next, referring to FIG. 15, a protection layer 107 is formed on the source/drain electrodes 106s and 106d and the top electrode 116, and a via hole that exposes one of the source/drain electrodes 106s and 106d is formed in the protection layer 107. The via hole is formed by patterning the protection layer 107 using a mask.

The protection layer 107 is formed of at least one organic insulating material selected from polyimide, polyamide, an acrylic resin, and a benzocyclobutene, and a phenolic resin, and by using a method such as a spin coating method. An upper surface of the protection layer 107 is planarized to prevent defects of an OLED.

Next, referring to FIG. 2, an OLED is formed on the protection layer 107 in the light emission area 1. The OLED is formed of two electrodes, that is, a pixel electrode 111 and an opposite electrode 121, and an intermediate layer 113, including an organic light emitting material, interposed between the two electrodes. The pixel electrode 111 may be used as an anode, and the opposite electrode 121 may be used as a cathode, or polarities of the electrodes may instead be exchanged.

The pixel electrode 111 is formed on the protection layer 107, and is electrically connected to the TFT via the via hole formed in the protection layer 107. The pixel electrode 111 may be formed of various materials according to types of light emission of the organic light emitting display device 101. For example, in a bottom-emission structure, in which an image is formed toward the substrate, or in a dual-emission structure, in which an image is formed both toward the substrate 100 and in an opposite direction to the substrate 100, the pixel electrode 111 is formed of a transparent metal oxide. The pixel electrode 111 may include at least one transparent conductive oxide (TCO) material, such as ITO, IZO, ZnO, and $In_2O_3$. Meanwhile, in a top emission structure in which an image is formed in an opposite direction to the substrate 100, the pixel electrode 111 may further include a reflective electrode formed of a light-reflecting material.

Next, an operation of forming a pixel defining layer 109, the intermediate layer 113 and the opposite electrode 121 on the pixel electrode 111 will be described with reference to FIG. 2 again. The pixel defining layer 109 is formed on the entire surface of the pixel electrode 111, and an opening portion exposing the pixel electrode 111 is formed in the pixel defining layer 109 to define a light emission unit.

Next, the intermediate layer 113 including an emissive layer is formed on the pixel electrode 111 that is exposed through the opening portion. The intermediate layer 113 may have a single-layer structure or a complex structure including at least one functional layer, such as an organic emissive layer (EML), a hole transport layer (HTL), a hole injection layer (HIL), an electron transport layer (ETL), and/or an electron injection layer (EIL).

The opposite electrode 121 may be deposited on the entire surface of the substrate 100 and is used as a common electrode. The opposite electrode may be formed by depositing silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), fluorinated lithium (LiF) to a small thickness. Also, the opposite electrode 121 may be formed as a reflective electrode or a semitransparent, electrode depending on a direction of light emission.

A capping layer including an inorganic material may be further formed on the opposite electrode 121 in order to protect the opposite electrode 121. Meanwhile, an encapsulation layer (not shown) is formed on the entire surface of the substrate 100 to cover the OLED formed on the substrate 100 in order to protect the OLED from the external air. The encapsulation layer may have a structure in which an organic material and an inorganic material are alternately stacked, or a single layer structure formed of a low-melting point inorganic material.

Hereinafter, the advantages of the manufacture of a TFT according to the method of the current embodiment of the present invention will be described in detail.

First, according to the method of manufacturing a TFT of the current embodiment of the present invention, an offset area of an oxide semiconductor pattern may be eliminated without an additional mask operation. In detail, an operation of forming photosensitive patterns for the purpose of plasma processing of first regions and second regions of the oxide semiconductor pattern is performed by using a mask operation, and an additional mask operation is not necessary. As illustrated in FIG. 6, by using a single halftone mask, a first photosensitive pattern for patterning an oxide semiconductor pattern is formed, and a second photosensitive pattern is formed from the first photosensitive pattern by using an ashing operation. Accordingly, a mask operation for forming the second photosensitive pattern is not added, and thus the manufacturing process is simplified to reduce the costs. Meanwhile, while a halftone mask is described above, the mask used here is not limited thereto, and also when photosensitive layers are patterned using a diffraction mask, the first and second photosensitive patterns may be formed without an additional mask operation.

Also, by directly plasma processing a portion of an oxide semiconductor pattern according to an embodiment of the present invention, the following effects may be obtained: An indirect process refers to a method of reducing an oxide semiconductor by forming a sacrificial layer on the oxide semiconductor and performing various processes such as plasma processing on the sacrificial layer. When indirectly performing an annealing operation, a vapor process, or a plasma process on a portion of an oxide semiconductor pattern, reduction of the oxide semiconductor occurs isotropically. Accordingly, edges of a channel region, which corresponds to the third region and which is not intended for reduction, is also partly reduced. This causes reduction in a channel length in terms of a ratio of a channel width and a length of a TFT, which includes an active layer formed of an oxide semiconductor. In general, a channel length of a TFT has to be increased to improve distribution of a threshold voltage and off current (Ioff) characteristics of the TFT. Consequently, a size of a TFT to which plasma processing is indirectly performed has to be increased in order to compensate for the decrease in the channel area due to the isotropic plasma process. This results in a decreased aperture ratio and an increased parasitic capacitance, making it difficult to apply an oxide semiconductor TFT in a display device that requires a high resolution. However, when an oxide semiconductor pattern is directly plasma processed as described in the method of manufacturing a TFT according to the current embodiment of the present invention, just desired portions may be reduced, and thus a decrease in an effective channel length due to reduction of a channel region is not caused.

With respect to reducing manufacturing processes, according to another embodiment of the present invention, after forming an oxide semiconductor pattern by using a first photosensitive pattern as illustrated in FIG. 8, an ashing operation may be performed on the first photosensitive pattern as illustrated in FIG. 9 to remove portions of photosensitive patterns P11 and P12 corresponding to the semi-transmissive units M13 of Mask M1 to form a second photosensitive pattern P21. The ashing operation may be performed using various methods. In particular, when an ashing operation is performed by using plasma, the second photosensitive pattern P21 may be formed simultaneously while a plasma processing is performed on first and second regions of the oxide semiconductor pattern by increasing the duration of the ashing operation.

In detail, since the first photosensitive pattern partially has differential thicknesses, a thick portion thereof corresponding to the third region as a result of the ashing operation is removed later than thinner portions thereof corresponding to the first and second regions. Accordingly, the second photosensitive pattern P21 corresponding to the third region remains after the ashing operation, and the first and second regions of the oxide semiconductor pattern are exposed at the same time, thus being exposed to the plasma. As a result, without performing an additional plasma process, an operation as illustrated in FIG. 10 may be performed just by using an ashing operation.

While a single TFT and a single capacitor are illustrated in the drawings of the present application, this is merely for convenience of description, and the present invention is not limited thereto. As long as the number of times a mask operation according to the present invention is performed is not raised, a plurality of TFTs and a plurality of capacitors may also be included.

According to the embodiment of the present invention, the organic light emitting display device 101 illustrated in FIG. 2 includes an OLED in the light emission area 1, however the present invention is not limited thereto. For example, the present invention may be embodied as a liquid crystal display device when liquid crystals are included between a pixel electrode and an opposite electrode.

According to the embodiments of the present invention, an offset area is not formed, and thus a TFT including an active layer formed of an oxide semiconductor and having a top gate structure may be manufactured. In addition, the top gate type TFT manufactured in this manner does result in a TFT with a characteristics distribution, and thus an organic light emitting display device including the TFT may have a high reliability.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a thin film transistor (TFT), comprising:
   forming an oxide semiconductor layer on a substrate;
   forming an oxide semiconductor pattern by using a first photosensitive pattern as a mask, the oxide semiconductor pattern includes a first region, a second region and a third region;
   directly plasma processing the first region and the second region of the oxide semiconductor pattern by using a second photosensitive pattern as a mask;
   removing the second photosensitive pattern;
   forming an insulating pattern on the substrate to cover the oxide semiconductor pattern after said direct plasma processing;
   forming a gate electrode on the insulating pattern to overlap with the third region; and
   forming a source electrode and a drain electrode that are insulated from the gate electrode and that contact the first region,
   wherein the second region is disposed between the first region and the third region.

2. The method of claim 1, wherein the directly plasma processing comprises reducing the first region and the second region.

3. The method of claim 1, wherein the first photosensitive pattern is formed using one of a halftone mask and a diffraction mask.

4. The method of claim 1, wherein the first photosensitive pattern is removed by using a plasma.

5. The method of claim 1, wherein the plasma process is formed using at least one gas selected from a group consisting of hydrogen gas, argon gas, helium gas, xenon gas, nitrogen gas, nitrogen oxide gas and oxygen gas.

6. A method of manufacturing an organic light emitting display device, comprising:
   manufacturing a thin film transistor (TFT) on a substrate;
   forming a protection pattern on the TFT;
   forming an organic light emitting diode (OLED) on the protection pattern; and forming an encapsulation pattern to encapsulate the OLED, wherein the manufacturing of a TFT comprises:

forming an oxide semiconductor layer on the substrate;

forming an oxide semiconductor pattern by using a first photosensitive pattern as a mask, the oxide semiconductor pattern includes a first region, a second region and a third region;

directly plasma processing the first region and the second region of the oxide semiconductor pattern by using a second photosensitive pattern as a mask;

removing the second photosensitive pattern;

forming an insulating pattern on the substrate to cover the oxide semiconductor pattern after said directly plasma processing;

forming a gate electrode on the insulating pattern to overlap with the third region; and forming a source electrode and a drain electrode that are insulated from the gate electrode and that contact the first region, wherein the second region is disposed between the first region and the third region.

7. The method of claim 6, wherein the directly plasma processing comprises reducing the first region and the second region.

8. The method of claim 6, wherein the second photosensitive pattern is formed by ashing the first photosensitive pattern.

9. The method of claim 6, wherein the second photosensitive pattern is removed simultaneously with the direct plasma processing.

10. A method of manufacturing an organic light emitting display device, comprising:

manufacturing a thin film transistor (TFT) on a substrate;

forming a protection pattern on the TFT;

forming an organic light emitting diode (OLED) on the protection pattern; and forming an encapsulation pattern to encapsulate the OLED, wherein the manufacturing of a TFT comprises:

forming an oxide semiconductor pattern including a first region, a second region, and a third region on the substrate;

directly plasma processing the first region and the second region of the oxide semiconductor pattern, wherein the plasma process is formed using at least one gas selected from a group consisting of hydrogen gas, argon gas, helium gas, xenon gas, nitrogen gas, nitrogen oxide gas and oxygen gas, wherein the direct plasma processing being used to simultaneously form a lower electrode of a capacitor by treating an oxide semiconductor pattern in a capacitor area external to the thin film transistor;

forming an insulating pattern on the substrate to cover the oxide semiconductor pattern after said directly plasma processing;

forming a gate electrode on the insulating pattern to overlap with the third region; and forming a source electrode and a drain electrode that are insulated from the gate electrode and that contact the first region, wherein the second region is disposed between the first region and the third region.

11. A thin film transistor (TFT), comprising:

an oxide semiconductor pattern that is formed on a substrate and comprises a first region, a second region, and a third region, wherein the second region is disposed between the first region and the third region, wherein each of the first and second regions being equally conductive by being exposed to a direct plasma process for an equal amount of time, the direct plasma process of the first and second regions of the oxide semiconductor pattern increases conductivity of exposed first and second regions of the oxide semiconductor pattern by increasing carrier density of the first and second regions of the oxide semiconductor pattern by increasing an oxygen vacancy therein by inducing oxygen defects in the exposed first and second regions of the oxide semiconductor pattern by reduction of the oxide semiconductor;

a gate electrode that is insulated from the oxide semiconductor pattern and overlaps the third region; and a source electrode and a drain electrode that are insulated from the gate electrode and contact the first region, wherein the second region has a smaller electrical resistance than the third region.

* * * * *